(12) United States Patent
Stinson et al.

(10) Patent No.: US 6,603,781 B1
(45) Date of Patent: Aug. 5, 2003

(54) MULTI-WAVELENGTH TRANSMITTER

(75) Inventors: Douglas G. Stinson, Fremont, CA (US); Michael Morelli, San Jose, CA (US); Patrick D. O'Rourke, Los Gatos, CA (US); Robert M. Elkow, Livermore, CA (US); Robert Thornton, Los Altos, CA (US)

(73) Assignee: Siros Technologies, Inc., Davis, CA (US)

( * ) Notice: Subject to any disclaimer, the term of this patent is extended or adjusted under 35 U.S.C. 154(b) by 0 days.

(21) Appl. No.: 10/097,536

(22) Filed: Mar. 14, 2002

Related U.S. Application Data

(63) Continuation-in-part of application No. 09/817,362, filed on Mar. 20, 2001.
(60) Provisional application No. 60/275,559, filed on Mar. 13, 2001, and provisional application No. 60/263,060, filed on Jan. 19, 2001.

(51) Int. Cl.$^7$ .................................................. H01J 3/098
(52) U.S. Cl. .............................. 372/23; 372/22; 372/70; 359/124
(58) Field of Search ............................... 372/70, 94, 46, 372/22, 98, 50, 92, 27, 28; 359/124, 419

(56) References Cited

U.S. PATENT DOCUMENTS

| | | | | |
|---|---|---|---|---|
| 5,214,524 A | * | 5/1993 | Shigematsu et al. | ......... 359/124 |
| 5,600,466 A | * | 2/1997 | Tsuhima et al. | ............. 359/124 |
| 5,850,292 A | * | 12/1998 | Braun | ......................... 356/419 |
| 6,404,522 B1 | * | 6/2002 | Handleman | .................. 359/124 |

* cited by examiner

Primary Examiner—Albert W. Paladini
(74) Attorney, Agent, or Firm—Sierra Patent Group, Ltd.

(57) ABSTRACT

Various aspects of multiple-channel light transmitting systems are disclosed. The system may include a multiple-wave length light source, a demultiplexer; a modulator, and a wavelocker. The wavelocker is configured to drive the light source such that said multiple wavelengths coincide with the ITU grid. The system may also include other elements including a locker or a mode-locking servo, where the servo is configured to adjust the mode locking method frequency to coincide with the spacing of the ITU grid. Further additional elements may include an optical amplifier or an equalizer. The equalizer may include a filter whose transmission function varies with wavelength.

36 Claims, 4 Drawing Sheets

MULTI-WAVELENGTH TRANSMITTER

RELATED APPLICATIONS

This application claims the benefit of priority to United States provisional patent application No. 60/275,559, filed Mar. 13, 2001, and this application is a Continuation-in-Part of U.S. patent application No. 09/817,362, filed on Mar. 20, 2001 which claims the benefit of priority to U.S. provisional patent application No. 60/263,060, filed Jan. 19, 2001.

BACKGROUND OF THE INVENTION

I. Field

This disclosure relates to an optical transmitter, and particularly to a dense wavelength division multiplexing transmitter architecture including a multi-wavelength emitting laser, optics and electronics for outputting data.

II. Background

Conventional optical transmitters contain a single wavelength light generator, a light modulator, and circuitry for accepting 'client data' and applying that data to the light modulator so that the light is modulated according to the data. Typically the modulator allows transmission of the light to represent a "1" and blocks transmission of the light to represent a "0". The transmitters also include various control and monitoring means. To create a conventional Dense Wavelength Division Multiplexing (DWDM) system, a multiplicity of these transmitters, one for each wavelength, may be assembled and the output of each combined using a multiplexer and placed on a single optical fiber. The specific wavelengths to be used are specified by the International Telecommunications Union and are commonly referred to as the "ITU Grid".

The wavelength of these lasers must be maintained to high precision as narrow band filters in the demultiplexer will be used to separate the wavelengths at the receiving end of the fiber. Unfortunately, the wavelength of conventional DFB lasers may drift with aging and temperature. Most detrimental is when two adjacent wavelengths drift toward each other. This requires filters in the demultiplexer which can unambiguously separate wavelengths separated by the small amount corresponding to the worst case drift. Filter expense increases as the separation between adjacent wavelengths decreases.

A further challenge to optical communications systems based on DWDM is ensuring that multiple wavelengths have equal relative power. This is desired to assure adequate Signal-to-Noise ratio in each channel without overloading the receiver of any one channel. Furthermore, optical communications systems often have one or more optical amplifiers between the transmitter and the receiver, and amplifiers used in these systems typically have the attribute of increasing the difference in power between wavelength channels.

The process of causing all the wavelengths to have the same power is referred to herein as equalization. In DWDM systems, equalization may be used in conjunction with optical amplifiers in order to compensate for the fact that the gain of these amplifiers is not the same at all wavelengths. In, for example, Erbium Doped Fiber Amplifiers (EDFA), gain varies only slowly with wavelength. Consequently, equalization can be achieved by introducing a filter whose loss also varies slowly and proportionally to the amplifier gain can also be employed.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION

Figure 1:
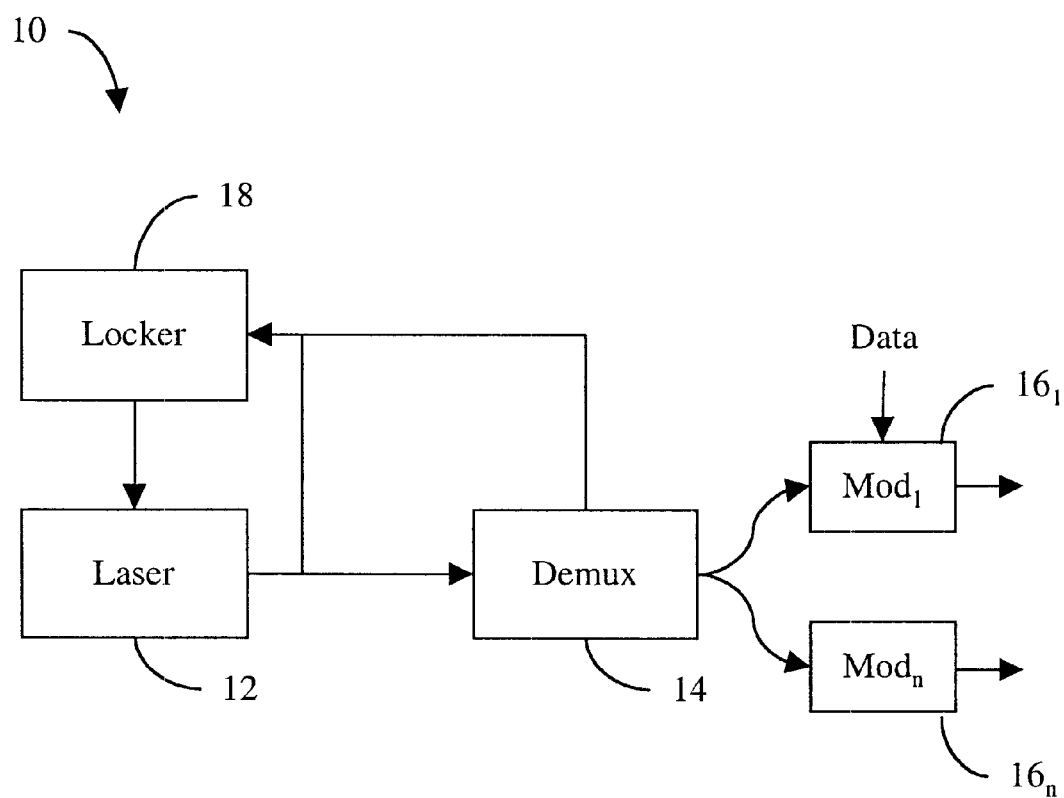
FIG. 1 is a conceptual diagram of one aspect of a disclosed multi-channel transmitting system.

Persons of ordinary skill in the art will realize that the following description of the present invention is illustrative only and not in any way limiting. Other embodiments of the invention will readily suggest themselves to such skilled persons having the benefit of this disclosure.

The following references are hereby incorporated by reference into the detailed description of the preferred embodiments, and also as disclosing alternative embodiments of elements or features of the preferred embodiment not otherwise set forth in detail above or below or in the drawings. A single one or a combination of two or more of these references may be consulted to obtain a variation of the preferred embodiment described above. In this regard, further patent, patent application and non-patent references, and discussion thereof, cited in the background and/or elsewhere herein are also incorporated by reference into the detailed description with the same effect as just described with respect to the following references:

U.S. Pat. Nos. 5,526,155, 5,347,525, 5,631,758, 6,141,127, and 6,172,803;

Wilmsen, Temkin and Coldren, et al., "Vertical Cell Surface Emitting Lasers, 2nd edition;

Ulrich Fiedler and Karl Ebeling, "Design of VCSELs for Feedback Insensitive Data Transmission and External Cavity Active Mode-Locking", IEEE JSTQE, Vol. 1, No. 2 (June 1995); and J. Boucart, et al., 1-mW CW-RT Monolithic VCSEL at 1.55 mm, IEEE Photonics Technology Letters, Vol. 11, No. 6 (June 1999).

FIG. 1 schematically illustrates one aspect of a DWDM multi-channel transmitter system 10. The system 10 includes a transmitter 12 containing a single light-generating source that simultaneously produces all desired wavelengths. This light generation source will be referred to herein as a "Multi-Wavelength Laser", or MWL, and one aspect will be described in more detail below.

The multiple wavelengths emanating from the light source 12 are separated in space using a demultiplexer 14 and directed to individual light modulators $16_{1...n}$. The number of modulators may correspond to the desired number of output channels.

The system 10 may also include a locker 18 for stabilizing the transmitter 102. The locker may receive feedback, such as power-related feedback from the output of the transmitter 12, or wavelength-related feedback from the demultiplexer 14. More detailed aspects of a locker will be disclosed below.

The system 10 may also contain structure as is known in the art for receiving client data and applying the data to selected light modulators 16. The output of the light modulators 16 may be substantially the same as the output of the light modulators of conventional transmitters. Therefore a single transmitter light source 12 configured in accordance with the teachings of this disclosure may be substituted directly for a multiplicity of conventional transmitter laser sources.

The specific arrangement of the multi-wavelength source 12, demultiplexer 14, and modulators 16$_{1...n}$ advantageously provides many benefits such as those enumerated below. The components of the transmitter of FIG. 1 are described in more detail below.

The light source 12 may comprise a wide variety of multiple-wavelength sources, such as U.S. Pat. No. 4,635, 246 Henry F. Taylor et. al., disclosing injection locking of multiple laser diodes; U.S. Pat. No. 4,839,884 to Robert Schloss, disclosing a semiconductor laser with multiple light emitting areas coupled to a diffraction grating, coupled to a partially reflecting mirror; U.S. Pat. No. 5,347,525 to Gregory Faris disclosing a mode locked laser; H. Sanjoh et. al. IEEE Photonics Technology Letters Vol 9, #6, June 1997, p 818, disclosing a mode-locked edge-emitting semiconductor laser coupled to a wavelength standard; M. Zirngibl, IEEE Communications Magazine December 1998, p 39, disclosing multiple optical amplifiers placed between mirrors; H. Shi et. al. IEEE Photonics Technology Letters Vol9\9, #6 November 1997, p 1439, disclosing a mode locked semiconductor optical amplifier coupled to a grating; and U.S. Pat. No. 5,963,567 to John Veselka et. al., disclosing a CW laser coupled to a periodic light modulator coupled to a non-linear element. The preceding references are all incorporated by reference as though fully set forth herein.

One aspect of a multiple-wavelength source suitable for use in this disclosure will now be disclosed.

Figure 2:
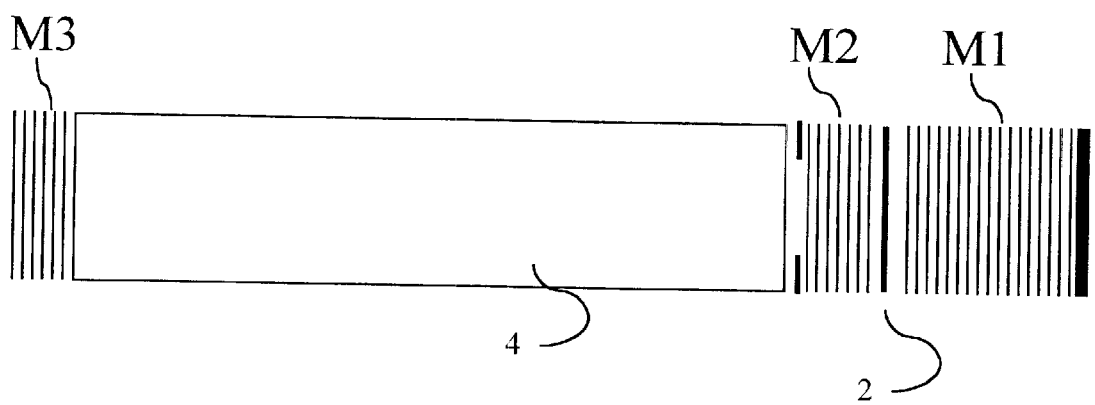
FIG. 2 is a conceptual diagram of one aspect of a multi-wavelength laser source.

FIG. 2 is a conceptual diagram of a multichannel light source and illustrates a three-mirror composite-cavity VCSEL configured in accordance with the teachings of this disclosure. The light source includes epitiaxially-grown mirrors M1 and M2, and an external mirror M3. In operation, mirror M3 controls frequency spacing between mode-locked modes by way of its distance from M2 and M3 (representing a cavity length L2), and provides output coupling of the laser energy. The combination of these mirrors defines two cavities: the VCSEL resonant or gain cavity 2, defined by M1 and M2; and an external cavity 4 defined by M2 and M3.

Figure 3:
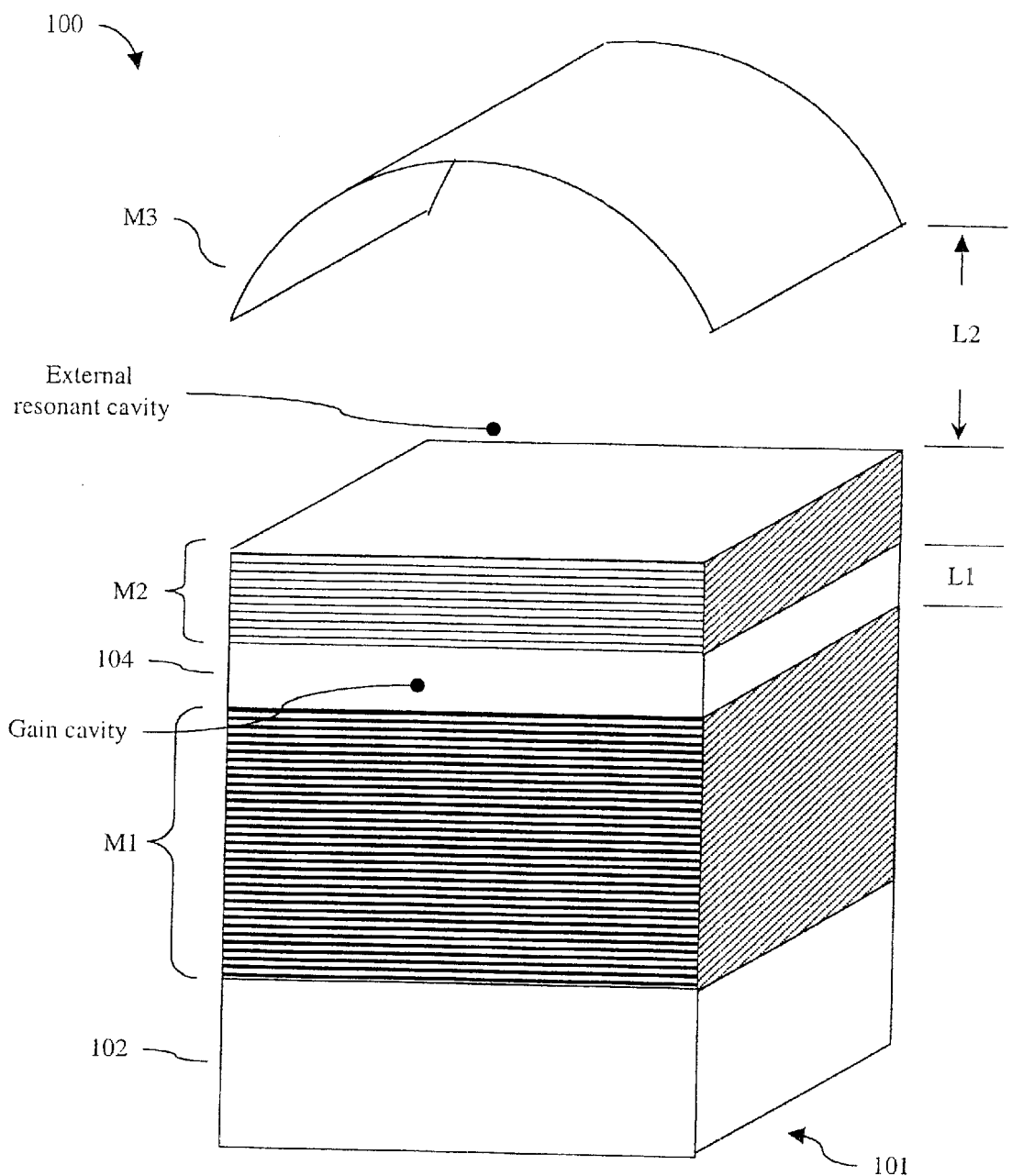
FIG. 3 is a more detailed conceptual diagram of one aspect of a multi-wavelength laser source.

FIG. 3 is a more detailed conceptual diagram of one aspect of a disclosed multifrequency light source 100. The light source 100 may include a VCSEL 101 having a substrate 102 for reflecting light at normal incidence. The substrate 102 may be formed from materials known in the art such as Gas or InP depending on the desired wavelength.

On top of the substrate 102 a mirror M1 is formed. The layers of M1 may be formed epitaxially using techniques known in the art. If the substrate 102 comprises GaAs, then the layers of M1 may be formed from alternating layers of GaAs/InGaAs for use in the wavelength range of 780–980 nm. Alternatively, if the substrate 102 comprises InP, the layers of M1 may formed of alternating layers of InGaAlAs/ InP for use in the wavelength range of 1300–1700 nm.

An active layer 104 for amplifying light is then grown on M1. The active layer 104 may comprise a quantum well active layer fashioned from the same materials as M1. The active layer 104 will have a gain response and a nominal peak frequency associated therewith. In one aspect of a disclosed light source, the active layer 104 may have a nominal peak frequency of 1550 nm. The nominal peak frequencies are typically functions of variables such as current or temperature.

A mirror M2 may then be grown on the active layer 104 using techniques similar to M1. The active layer 104, combined with mirror layers 102 and M3 comprise a resonant cavity for which can be associated an effective cavity length L1.

The light source 100 may further include a mirror M3 disposed a distance L2 from the upper surface of M2.

A multi-frequency light source 100 is thus formed including a VCSEL 101 and an external mirror M3 wherein several alternative designs and variations may be possible. The light source 100 may be described in terms of the distance L1 between mirrors M1 and M2 forming a gain cavity and the distance L2 between mirrors M2 and M3 forming an external cavity.

In general, the cavity length of the external cavity may be greatly extended compared with a conventional VCSEL device. The external cavity may be, e.g., between a few hundred microns and several millimeters, and is particularly preferred around 2–3 mm in physical length for a mode-spacing of 50 GHz. For example, at 50 GHz and for a refractive index n=1 (such as for an air or inert gas filled cavity), then the cavity will have a physical length L2 of about 3 mm, which provides a 3 mm optical path length corresponding to 50 GHz. The actual cavity length to achieve 50 GHz may also depend on the reflective indices of the media between M2 and M3. For example, for a cavity material such as glass, e.g., n=1.5, then the physical length will be around 2 mm to provide the optical path length of 2 mm×1.5=3 mm, again corresponding to a 50 GHz mode spacing.

The distance L2 and thus the cavity length may be increased to reduce the mode-spacing. For example, by doubling the cavity length, e.g., to 4–6 mm, the mode-spacing may be reduced to 25 GHz, or by again doubling the cavity length, e.g., to 8–12 mm, the mode-spacing may be reduced to 12.5 GHz. The mode-spacing may be increased, if desired, by alternatively reducing the cavity length, e.g., by reducing the cavity length to half, e.g., 1–1.5 mm to increase the mode-spacing to 100 GHz. Generally, the mode-spacing may be advantageously selected by adjusting the cavity to a corresponding cavity length. The device of the preferred embodiment may utilize other means for reducing the mode-spacing as understood by those skilled in the art.

This extension of cavity length from that of a conventional VCSEL is permitted by the removal or partial removal of a mirrored reflector surface of the mirror M2 and inclusion of mirror M3. The light source 100 and in particular the mirror M3 may be formed as disclosed in co-pending application No. 09/817,362, filed Mar. 20, 2001, and assigned to the same assignee of the present application, and incorporated by reference as though set forth fully herein.

The extension of the external cavity out to 1.5–15 mm permits a 10–100 GHz mode spacing, since the cavity will support a number of modes having a spacing that depends on the inverse of the cavity length (i.e., c/2nL, where c is the speed of light in vacuum, n is the refractive index of the cavity material and L is the cavity length). The VCSEL with external cavity device for providing multiple channel signal output according to a preferred embodiment herein is preferably configured for use in the telecom band around 1550 nm, and alternatively with the telecom short distance band around 1300 nm or the very short range 850 nm band. In the 1550 nm band, 100, 50, 25 and 12.5 GHz cavities are of particular interest as they correspond to standard DWDM channel spacings.

The monolithic portion of the light source 100 may be around 15 microns tall when formed on a substrate 100–700

μm thick and preferably comprises a gain medium of InGaAsP or InGaAs and InGaAlAs or In GaAsP or AlGaAs mirrors (or mirrors formed of other materials according to desired wavelengths as taught, e.g., in Wilmsen, Temkin and Coldren, et al., "Vertical Cavity Surface Emitting Lasers, 2nd edition, Chapter 8).

The light source 100 may be formed in a variety of manners. For example, the second mode spacing cavity may be formed by a solid lens of either conventional or gradient index design, and may be formed of glass. When a gradient index lens is used, the index of refraction of the material filling the cavity varies (e.g., decreases) with distance from the center optical axis of the resonant cavity. Such GRIN lens provides efficient collection of the divergent light emitted from the laser cavity. In an embodiment using a GRIN lens, the mirrored surface of mirror M3 may be curved or flat, depending on design considerations.

The mirror M3 may have one or more coatings on its remote surface such that it efficiently reflects incident light emitted from the VCSEL 101 as a resonator reflector, preferably around 1550 nm for the telecom band. The mirror M3 is preferably formed of alternating high and low refractive index materials to build up a high reflectivity, such as alternating quarter-wavelength layers of $TiO_2/SiO_2$ or other such materials known to those skilled in the art.

The radius of curvature of the lens may be around the length the second cavity. Emitted radiation from the VCSEL 101 will diverge outward from the gain region substantially be reflected directly back into the gain region when the radius of curvature is approximately the cavity length, or around 2–3 mm for a 50 GHz mode-spacing device.

The two cavities of the light source 100 will each have corresponding resonant modes associated therewith, as illustrated in FIG. 3. The resonant modes for the external cavity defined by the distance L2 are shown as plot 300, and corresponding resonant mode plot for the gain cavity defined by the distance L1 is shown as plot 310.

In operation, the cavities provide one or more resonant nodes at optical frequencies for which the roundtrip gain exceeds the loss. For a longer cavity such as the external cavity, the resonant nodes form a comb of frequencies having a separation inversely proportional to the cavity length. For example, for a cavity optical length of 3 mm, the optical spacing of the modes is approximately 50 GHz.

The light amplifying active layer will typically have a gain bandwidth of 2–4 THz (2000–4000 GHz). Thus, many such nodes will fit within the gain bandwidth of the gain material.

However, the gain cavity of the VCSEL gain cavity typically has a micron-scale optical length and thus a much greater modal spacing, typically in the multi-THz range. Since L2>>L1, many more resonant modes will occur in the external cavity in a given frequency spectrum than will occur in the gain cavity. In fact in the typical instance, there may be only one resonant mode in the first cavity which falls in the corresponding gain bandwidth of the laser, as is illustrated in FIG. 3.

Thus, typically only one resonance will exist in the gain bandwidth. The breadth of this resonance depends on the values of M2 and M3 and may range from a few GHz to 1 THz.

When the two cavities defined by (M1 and M2) and (M2 and M3) are put together, they must jointly satisfy roundtrip phase boundary conditions for laser operation. If the modes of the second cavity do not overlap with at least one of the modes of the first cavity, then laser emission will not be achieved.

Thus, when combining the fine comb frequencies of an external cavity with the single resonance of a VCSEL gain cavity, lasing may be limited to cavity resonances which lie within the resonant bandwidth of the VCSEL gain cavity. The width of the resonance of the VCSEL cavity may be varied by varying M1 and M2, such that the gain cavity resonance can span multiple external resonances.

Two typical specifications for DWDM-based systems are channel frequency spacing and number of channels. The product of these two represents the emission bandwidth and is therefore an essential requirement for any multiwavelength device.

The response of the device thus depends on the relative reflectivity of the mirrors, the gain response and bandwidth of the amplifying region, and the relationship between the resonances of the gain regions of both cavities.

In one aspect of a disclosed multi-frequency light source, the spectral bandwidth of the light source may be controlled by varying the reflectivity of M2. The reflectivity of M2 may be controlled by altering the number of layer pairs used to form the mirror. As the reflectivity of M2 is decreased, the spectral bandwidth will increase.

Figure 4:
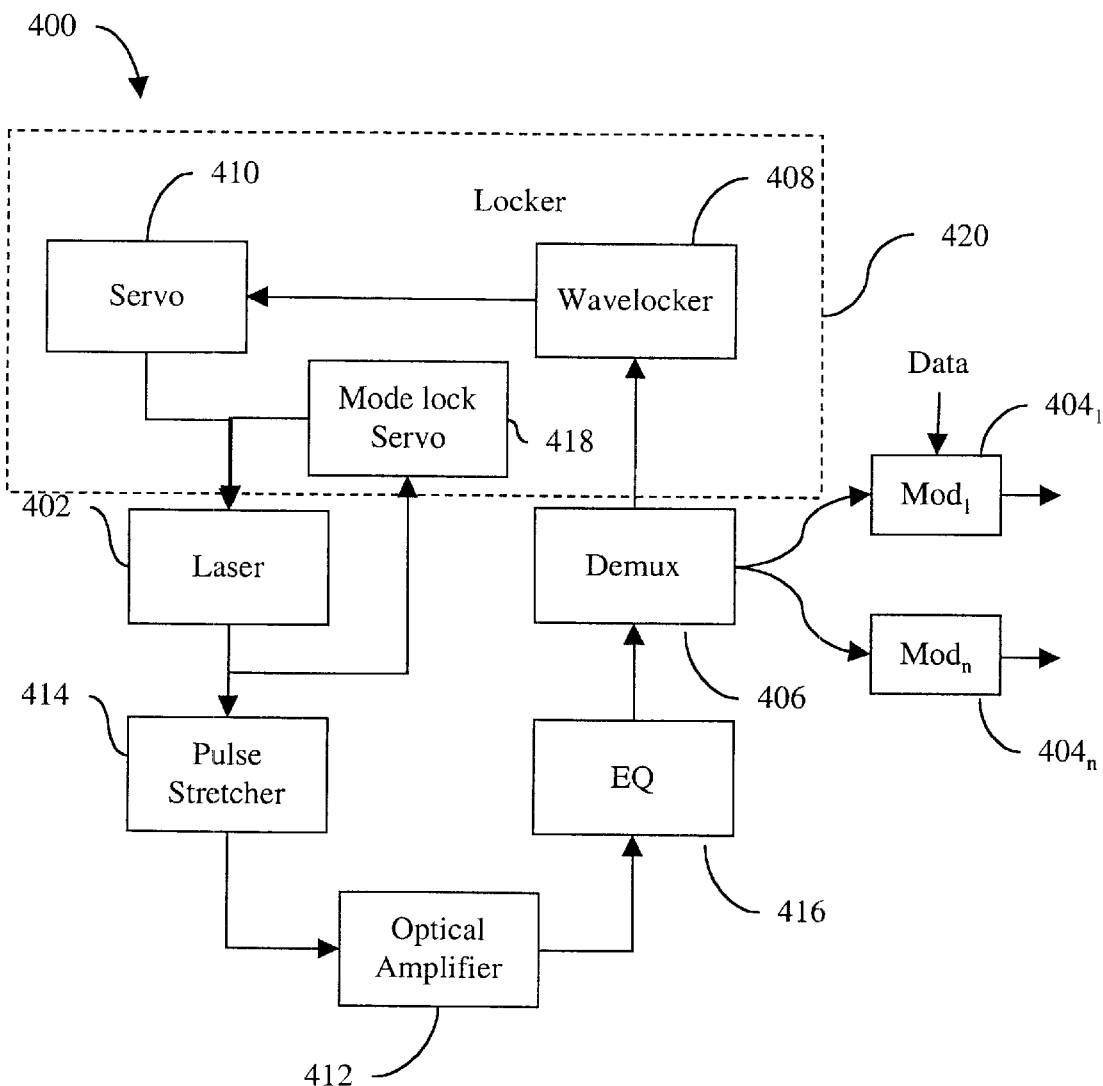
FIG. 4 is a conceptual diagram of a further aspect of a disclosed multi-channel transmitting system, illustrating additional elements.

FIG. 4 is a diagram of a further aspect of a multi-channel transmitter system 400 including additional elements that can be added to optimize the performance of the device according to the requirements of specific applications. It is to be understood that the additional elements of FIG. 4 may be added individually or in combination as desired.

The system 400 may include a multi-wavelength light source 402, one or more modulators $404_{1...n}$, and a demultiplexer 406, all as disclosed above.

Locker 18 in FIG. 1 (item 420 in FIG. 4) may consist of one or more subsystems that perform different functions. In one embodiment, system 400 may include a wavelocker 408. The optical path length of laser cavity determines not only the mode spacing but the absolute wavelength of each mode as well. For many applications the length of a temperature-controlled external cavity composed of glass or air will be sufficiently stable to meet wavelength requirements. However, when additional stability is required, a small fraction of light from one of the output channels of the demultiplexer 406 may be sampled and directed to a wavelocker 408.

Several methods of constructing a wavelocker are known in the art and may be employed in this disclosure. One such method consists of placing two partially reflecting mirrors on the ends of a hollow cylinder made from a material with a low thermal coefficient of expansion, thus forming a Fabry-Perot resonant cavity. Only light of specific wavelengths will be transmitted through the cavity. The length of the cavity is adjusted so that the transmitted wavelength differs from an ITU grid wavelength by a small amount, and an electrical signal proportional to the light transmitted is subtracted from an electrical signal proportional to the light incident on the cavity. The resultant electrical error signal is proportional to the difference between the incident wavelength and the ITU grid wavelength.

This wavelocker error signal may then be used to drive a temperature controller servo 410 (or other length actuator) attached to the laser external cavity. This causes the wavelength of the mode corresponding to the sampled multiplexer channel to coincide with the ITU grid with the precision of the wavelocker. Since, in the MWL of this invention, all wavelengths have a fixed relationship to one another, all wavelengths will be driven to an ITU grid wavelength. Since the wavelocker can be optimized specifically for wavelength accuracy and stability independent of other considerations, improved wavelength stability can be achieved. In a conventional DWDM system, similar stability can be achieved only by using a separate wavelocker for each wavelength.

The system 400 may also include a mode locking servo 418. A typical problem with lasers operating in multiple modes, as does the MWL, is that energy can randomly transfer from mode to mode. This causes fluctuations in the power of each wavelength resulting in noise. This problem is eliminated by mode locking the laser. One type of mode locking, known as "Amplitude Modulated" or "AM" mode locking, is accomplished by modulating the gain of the laser at a rate corresponding to the round trip time of light in the cavity. For example, in a MWL designed to operate with a 50 GHz frequency spacing, the laser would be moduled at 50 GHz. In one embodiment herein, the laser 402 is an electrically pumped laser. Modulation of the gain is achieved by varying the current through the laser periodically. The optical power emitted by the multiwavelength laser 402 may be maximized when this current is modulated exactly at the mode spacing frequency determined by the length of the resonant cavity of the laser 402. This can be achieved by using a stable frequency source and adjusting it to match the cavity mode spacing during manufacture. A less stable, and therefore less expensive, frequency source can be used and the adjustment step eliminated if the cavity itself is used as a frequency reference. This is accomplished by using a servo 418.

The servo 418 may be configured to cause the frequency of mode-locking current to deviate slightly in a periodic fashion, known as dithering the frequency. Since the power from the laser is maximized only when the frequency of the mode-locking clock matches the mode spacing frequency of the resonant cavity of the laser 402, this causes a periodic variation in the output power of the laser 402. A small portion of the light from the laser 402 may be directed to the servo 418, where an electrical signal proportional to the light intensity may be created. This electrical signal may be compared to the signal dithering the laser mode-locking frequency by the method known as Phase Sensitive Detection. The magnitude and phase of the signal produced by the Phase Sensitive Detector is proportional to the signed difference between the mode-locking clock center frequency and the cavity mode spacing frequency. This error signal is then used to adjust the center frequency of the mode-locking clock to coincide with the cavity mode spacing frequency.

The system 400 may also include an optical amplifier 412. Since the optical power of laser 402 is divided between each of the multiple wavelengths emitted, the power in any one wavelength may be too low for the intended application. In this case an optical amplifier 412 may be included in the transmitter system 400. It is contemplated that a wide variety of optical amplifiers may be employed, for example an Erbium Doped Fiber Amplifier (EDFA), or preferably a Semiconductor Optical Amplifier (SOA).

An amplifier may be used either at the output of the laser 402, wherein use of such an amplifier at the output of a single wavelength transmitter is referred to as a "Booster Amplifier", or the amplifier may be placed along the optical fiber after multiplexing, wherein the amplifier is referred to as a "Line Amplifier".

Incorporating the amplifier 412 between the laser 402 and the demultiplexer 406 is preferred in this embodiment and has several advantages. First, instead of having a booster amplifier for each wavelength, one amplifier 412 may be used to simultaneously amplify all of the multiple wavelengths emitted by the laser 402, leading to advantageous cost, footprint and power consumption reductions. Line Amplifiers also amplify all wavelengths simultaneously, however they operate on modulated signals, wherein the output of the laser 402 at the amplifier 412 is unmodulated.

Fluctuations in the optical power at one wavelength in an amplifier may change the gain at another wavelength, causing crosstalk interference between signals on different wavelengths. Line Amplifiers in such configurations must therefore be carefully designed to minimize this crosstalk. By contrast, the optical amplifier 412 preferred herein operates on unmodulated light, avoiding the occurrence of crosstalk. This permits the use of a less complicated and/or less expensive optical amplifier. For example an SOA is typically less expensive and smaller in size than an EDFA, but they are generally unsuitable as line amplifiers in a DWDM system as crosstalk is a particular problem with these devices. However, in the multiwavelength transmitter this characteristic of SOAs is not a limitation.

Additionally, optical amplifiers can be generally a source of noise due primarily to Amplified Spontaneous Emission (ASE). Placing an amplifier 412 before an element that attenuates the signal results in a higher signal-to-noise ratio (SNR) than placing the amplifier 412 after the attenuating elements. This is because the elements attenuate the noise to the same degree they attenuate the signal. The modulators 404 cause the amplifier noise to appear only on "1"s and not on "0"s, further reducing the impact of amplifier noise in accord with a preferred embodiment herein.

The system 400 may further include a pulse stretcher 414. For AM mode-locking, the output of mode-locked laser 402 will be a sequence of pulses resulting from a specific phase relationship between the various wavelengths of light emitted by the laser 402. This relationship causes all of the wavelengths to interfere constructively at certain times and destructively at all other times. The time between pulses is equal to the reciprocal of the difference in frequency from one emitted wavelength to the next. For a laser designed to produce wavelengths separated by 50 GHz according to the ITU Grid, the time between pulses would be 20 ps. The width of the pulse is proportional to the reciprocal of the difference in frequency of the shortest wavelength line and the longest wavelength line. For a device that emits 8 wavelengths this width would be approximately 2 ps. As a result the peak power within a pulse will be on the order 10 times the average power. This high peak power can have several deleterious effects including damage to optical components, saturating optical amplifiers (reducing their effective gain) or introducing non-linear effects. To remediate these effects a pulse stretcher 414 may be deployed prior to the sensitive element.

A pulse stretcher suitable for use herein may be comprised of one or more optical elements the combined effect of which is to have the speed of light strongly dependent on wavelength. This has the effect of changing the phase relationship between the different wavelengths. A pulse stretcher can consist of a length of optical fiber coiled to a convenient size. Optical fibers are characterized by a chromatic dispersion parameter D given in ps/nm-km. Two initially coincident signals whose wavelength differs by 1 nm will be separated in time by D ps after traveling 1 km in a fiber with chromatic dispersion parameter D. Specialty fibers, for example the Sumitomo Electric Industries DCFM series of fibers, are available with large values of D reducing the length of fiber required. Alternatively, diffraction gratings can be used to separate the different wavelengths, cause them to follow paths of different lengths, and then recombine the wavelengths. Other embodiments may included reflective arrangements such as that described in Japanese patent no. 6-214,187 to Kobayashi, which is hereby incorporated by reference, wherein the pulse is reflected many times from a system of mirrors, and portions of the intensity of pulses travel different distances depending on when they are outcoupled from the reflective pulse stretcher. Double reflection prisms may also be used, wherein multiple reflections of the pulse tends to spread the pulse. Other optical pulse stretching arrangements may be used with a multiple channel transmitter according to a preferred embodiment herein.

The system 400 may also include an equalizer 416. A combination of the laser gain as a function of wavelength, the bandpass of the external optical cavity, and details of the mode locking process, can cause variation in power between wavelengths. When utilized, an amplifier may also introduce a variation in gain with wavelength. It is desired to have a DWDM transmission system wherein all wavelengths have substantially the same intensity. An equalizer 416 may thus be utilized. Several alternative aspects of an equalizer 416 are described below.

In a first aspect, an equalizer 416, the system 400 may include an equalizer 416 comprising of a filter whose transmission or loss function varies with wavelength. Generally the intensity vs. wavelength envelope will be a smoothly varying function such as a Gaussian. A characteristic of the laser 402 is that the relative intensities of the several wavelengths is constant, due to the use of mode-locking mentioned above. Therefore placing a filter as an equalizer 416 in the light path can be advantageously used to equalize the intensities.

Such a filter as equalizer 416 may have loss as a function of wavelength proportional to the ratio of the output power at a given wavelength to the output power preferably of the weakest channel, or alternatively another reference value, as emitted by the laser module 402. If an optical amplifier is included in the transmitter system, then the loss of the filter as equalizer 416 as a function of wavelength is preferably proportional to the loss function described above multiplied times the amplifier gain versus wavelength.

This filter 416 can be placed anywhere between the laser 402 and the demultiplexer 406. However, the filter 416 is most advantageously placed after the amplifier 412, or between the stages of a multi-stage amplifier, in order to maximize SNR.

In a second aspect, a multi-channel transmitter 400 may be used in which the equalizer 416 is included with the modulators 404. In this embodiment, the modulators 404 are biased such that they partially attenuate the light that passes through them. The degree of attenuation is proportional to the ratio of the intensity of the light entering that particular modulator 404 to the intensity of the weakest channel or other reference value. The filter as equalizer 416 aspect is preferred, as it is not susceptible to drift and noise in the electrical bias circuit.

The two methods just described can also advantageously be used together, with the filter as equalizer 416 removing the majority of the intensity variation and the modulator bias as additional equalizer 416 being used to remove any residual variation due to, for example, differences from one laser 402 to the next, or to variation introduced by the demultiplexer 406.

In a third aspect, a multi-channel transmitter 400 may include a plurality of filters used as an equalizer 416, wherein the filters are located between the outputs of the demultiplexer 406 and their respective modulators 404. Each filter of the equalizer 416 preferably has a loss proportional to the ratio of the power in its particular channel to the power of the weakest channel or other reference value. The disclosure of U.S. Pat. No. 6,181,449 is incorporated by reference herein as detailing alternatives to the equalizer 416 according to this embodiment.

In a fourth aspect, the equalizer 416 may be deployed within the demultiplexer 406. In this embodiment, the demux 406 may have an Arrayed Wave Guide (AWG) structure. The AWG is designed so that the loss in each wavelength is proportional to the ratio of the power in that wavelength to the power in the weakest channel or other reference value.

In a fifth aspect, a demultiplexer 406 may again include the equalizer 416 is this embodiment as with the fourth embodiment just described, but where the demux 406 comprises an array of thin film filters acting as both demultiplexer and equalizer 416. In a preferred example, light is directed to a first filter that is designed to transmit a single wavelength and reflect all others of interest. The reflected light is directed to a second filter that is designed to transmit a second wavelength while reflecting all others. This is repeated until all wavelengths of interested have been transmitted by some filter. The loss of each filter is adjusted to be proportional to the ratio of the power in the transmitted wavelength to the power in the weakest channel or other reference value. Preferably, the filters are ordered such that the weakest channel is transmitted by the first filter, the second weakest by the second, and so forth. This uses the unavoidable losses on reflection to advantage.

The previous description of various embodiments, which include preferred embodiments, is provided to enable any person skilled in the art to make or use the present invention. The various modifications to these embodiments will be readily apparent to those skilled in the art, and the generic principles defined herein may be applied to other embodiments without the use of the inventive faculty. Thus, the present disclosure is not intended to be limited to the embodiments shown herein but is to be accorded the widest scope consistent with the principles and novel features disclosed herein.

What is claimed is:

1. A multiple-channel light transmitting system comprising:
   a multiple-wave length light source optically coupled to a demultiplexer;
   at least one modulator optically coupled to said demultiplexer;
   a wavelocker having an input configured to sense the output of said demultiplexer, and an output configured to control said light source; and
   wherein said wavelocker is configured to drive said light source such that said multiple wavelengths coincide with the ITU grid.

2. A multiple-channel light transmitting system comprising:
   a multiple-wave length light source optically coupled to a demultiplexer;
   at least one modulator optically coupled to said demultiplexer;
   a locker configured to modulate the gain of said light source;
   a mode-locking servo having an input configured to sense the output of said light source, and an output configured to control said light source; and wherein said mode locking servo is configured to adjust the mode locking method frequency to coincide with the spacing of the ITU grid.

3. The system of claim 1 or 2, further including an optical amplifier optically coupled between said light source and said demultiplexer.

4. The system of claim 3, wherein said optical amplifier comprises a Semiconductor Optical Amplifier (SOA).

5. The system of claim 1 or 2, further including an equalizer optically disposed between said lights source and said demultiplexer.

6. The system of claim 5, wherein said equalizer comprises of a filter whose transmission function varies with wavelength.

7. The system of claim 5, wherein said equalizer is operatively disposed within said at least one modulator.

8. The system of claim 5, wherein said equalizer comprises a plurality of filters.

9. The system of claim 5, wherein said equalizer is operatively disposed within said demultiplexer.

10. The system of claim 9, wherein said equalizer comprises an Arrayed Wave Guide (AWG) structure.

11. The system of claim 9, wherein said equalizer and demultiplexer are combined and comprise a plurality of partially reflecting and partially transmitting filters.

12. The system of claim 11, wherein the filters are ordered such that each successive filter passes a wavelength higher pre-equalization intensity.

13. The system of claim 1, further including a wavelocker and servo optically disposed between said demultiplexer and said light source.

14. The system of claim 2, wherein said mode locking s\servo is configured to dither the frequency of said modelocker.

15. The system of claim 5, further including a pulse stretcher optically disposed between said light source and said optical amplifier.

16. The system of claim 15, wherein said pulse stretcher comprises an optical fiber.

17. The system of claims 1 or 2, wherein said light source comprises:

a gain region defined by a first and second mirror, said gain region having a corresponding response shape;

an external cavity defined by a third mirror and said second mirror, said external cavity having a plurality of resonant modes; and wherein said second mirror is formed such that said response shape of said gain region selects at least two of said plurality of modes.

18. The light source of claim 17, wherein said first mirror and the gain region is fabricated for use in the wavelength range of approximately 780–790 nm.

19. The light source of claim 17, wherein said first mirror and the gain region is fabricated for use in the wavelength range of approximately 1300–1700 nm.

20. The light source of claim 17, wherein said gain region response shape has a nominal peak wavelength of approximately 1550 nm.

21. The light source of claim 17, wherein said external cavity is greatly extended in length compared to said gain region.

22. The light source of claim 17, wherein the length of said external cavity has a length of approximately 2–3 mm.

23. The light source of claim 17, wherein said plurality of resonant modes have a mode spacing of approximately 100 GHz.

24. The light source of claim 17, wherein said plurality of resonant modes have a mode spacing of approximately 50 GHz.

25. The light source of claim 17, wherein said external cavity is filled with air and has a length of approximately 3 mm.

26. The light source of claim 17, wherein said external cavity comprises glass and has a length of approximately 2 mm.

27. The light source of claim 17, wherein the length of said external cavity has a length of approximately 4–6 mm.

28. The light source of claim 17, wherein said plurality of resonant modes have a mode spacing of approximately 25 GHz.

29. The light source of claim 17, wherein the length of said external cavity has a length of approximately 8–12 mm.

30. The light source of claim 17, wherein said plurality of resonant modes have a mode spacing of approximately 12.5 GHz.

31. The light source of claim 17, wherein said light source is configured for use in the wavelength range of 1550 nm.

32. The light source of claim 31, wherein said external cavity is configured to provide mode spacing corresponding to standard DWDM channel spacings.

33. The light source of claim 32, wherein said external cavity provides a mode spacing of 12.5 GHz.

34. The light source of claim 32, wherein said external cavity provides a mode spacing of 50 GHz.

35. The light source of claim 32, wherein said external cavity provides a mode spacing of 100 GHz.

36. The light source of claim 17, wherein the properties of said second mirror may be adjusted so as to select a predetermined plurality of said external cavity resonant modes.

* * * * *